United States Patent
De Gersem

(10) Patent No.: US 11,243,477 B2
(45) Date of Patent: Feb. 8, 2022

(54) LITHOGRAPHIC APPARATUS, AN OPERATING METHOD AND DEVICE MANUFACTURING METHOD

(71) Applicant: ASML Netherlands B.V., Veldhoven (NL)

(72) Inventor: Gudrun Ghilaine Agnes De Gersem, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/962,940

(22) PCT Filed: Dec. 14, 2018

(86) PCT No.: PCT/EP2018/084945
§ 371 (c)(1),
(2) Date: Jul. 17, 2020

(87) PCT Pub. No.: WO2019/141450
PCT Pub. Date: Jul. 25, 2019

(65) Prior Publication Data
US 2021/0132512 A1  May 6, 2021

(30) Foreign Application Priority Data

Jan. 19, 2018 (EP) .................... 18152449

(51) Int. Cl.
*G03F 7/20* (2006.01)
(52) U.S. Cl.
CPC ...... *G03F 7/70758* (2013.01); *G03F 7/70358* (2013.01); *G03F 7/70891* (2013.01)
(58) Field of Classification Search
CPC ............. G03F 7/70758; G03F 7/70358; G03F 7/70891; G03F 7/70691–709;
(Continued)

(56) References Cited

U.S. PATENT DOCUMENTS 5,258,594 A    11/1993 Pioch et al.
2001/0055102 A1* 12/2001 Emoto ................ G03F 7/70858
                                                            355/53
(Continued)

FOREIGN PATENT DOCUMENTS

EP    1 276 016 A2    1/2003
JP    H09238449 A     9/1997
(Continued)

OTHER PUBLICATIONS

International Search Report and Written Opinion of the International Searching Authority, directed to related International Patent Application No. PCT/EP2018/084945, dated Mar. 22, 2019; 12 pages.
(Continued)

*Primary Examiner* — Christina A Riddle
(74) *Attorney, Agent, or Firm* — Sterne, Kessler, Goldstein & Fox P.L.L.C.

(57) ABSTRACT

The invention relates to a lithographic apparatus comprising: an actuation system for positioning an object; a control unit (CU) for controlling the actuation system; and a cooling system for cooling the actuation system, wherein the actuation system comprises a coil assembly (CA) including one or more coils (CO) as force generating members, wherein the cooling system comprises cooling element (CE) interacting with the coil assembly for cooling the coil assembly, and wherein the control unit is configured to control a temperature of the one or more coils to keep a magnitude of cyclic stress below a predetermined value.

19 Claims, 2 Drawing Sheets

(58) Field of Classification Search
CPC ............... G03F 7/70858; H02K 41/00; H02K 41/02–033; H02K 9/00; H02K 9/10–20; H02K 9/225; H02K 9/24
USPC ............................................. 355/30, 72–77
See application file for complete search history.

(56) References Cited

U.S. PATENT DOCUMENTS

| | | | |
|---|---|---|---|
| 2008/0212042 A1* | 9/2008 | Morimoto | G03F 7/70858 355/30 |
| 2010/0156198 A1 | 6/2010 | Cooper et al. | |
| 2011/0063063 A1 | 3/2011 | Koops et al. | |
| 2015/0098067 A1* | 4/2015 | Koevoets | G03F 7/70758 355/30 |
| 2017/0023869 A1* | 1/2017 | Rothenhoefer | G02B 7/181 |

FOREIGN PATENT DOCUMENTS

| | | |
|---|---|---|
| JP | 2006074961 A | 3/2006 |
| WO | WO 2013/167463 A1 | 11/2013 |
| WO | WO 2016/093185 A1 | 6/2016 |

OTHER PUBLICATIONS

International Preliminary Report on Patentability directed to related International Patent Application No. PCT/EP2018/084945, dated Jul. 21, 2020; 8 pages.

\* cited by examiner

LITHOGRAPHIC APPARATUS, AN OPERATING METHOD AND DEVICE MANUFACTURING METHOD

CROSS-REFERENCE TO RELATED APPLICATIONS

This application claims priority of EP application 18152449.7 which was filed on 19 Jan. 2018 and which is incorporated herein in its entirety by reference.

BACKGROUND

Field of the Invention

The present invention relates to a lithographic apparatus, a method for operating a lithographic apparatus, and a device manufacturing method using a lithographic apparatus.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic apparatus, a plurality of actuation systems may be provided to position components such as stages, lenses, etc. in the lithographic apparatus. Commonly used in the actuation systems are coils as force generating members. The coils are electric current carrying members and as a result thereof also generate heat. During the lifetime of the lithographic apparatus, the coils and thus also the material surrounding the coils may go through many thermal cycles with corresponding thermally induced stresses and strains which may damage parts of the actuation system. Especially in case of large variations or unknowns in fatigue of parts of the actuation system, large safety margins and conservative designs are used and/or the average loads of the actuation systems must be relatively low to achieve desired lifetime.

SUMMARY

It is desirable to provide a lithographic apparatus in which the effects caused by the plurality of thermal cycles in the actuation system is reduced.

According to an embodiment of the invention, there is provided a lithographic apparatus comprising:
  an actuation system for positioning an object;
  a control unit for controlling the actuation system; and
  a cooling system for cooling the actuation system,
  wherein the actuation system comprises a coil assembly including one or more coils as force generating members,
  wherein the cooling system comprises a cooling element interacting with the coil assembly for cooling the coil assembly,
  and wherein the control unit is configured to control a temperature of the one or more coils to keep a magnitude of cyclic stress below a predetermined value.

According to another embodiment of the invention, there is provided a lithographic apparatus comprising:
  an actuation system for positioning an object;
  a control unit for controlling the actuation system; and
  a cooling system for cooling the actuation system,
  wherein the actuation system comprises a coil assembly including one or more coils as force generating members,
  wherein the cooling system comprises a cooling element interacting with the coil assembly for cooling the coil assembly,
  wherein the control unit is preferably configured to provide a force generating electric current to the one or more coils of the coil assembly aiming to position the object,
  and wherein the control unit is further configured to keep a temperature difference between the one or more coils of the coil assembly and the cooling element within a predetermined range for a predetermined amount of time during positioning of the object.

According to an embodiment of the invention, there is provided a lithographic apparatus comprising:
  an actuation system for positioning an object;
  a control unit for controlling the actuation system; and
  a cooling system for cooling the actuation system,
  wherein the actuation system comprises a coil assembly including one or more coils as force generating members,
  wherein the cooling system comprises a cooling element interacting with the coil assembly for cooling the coil assembly,
  wherein the control unit is preferably configured to provide a force generating electric current to the one or more coils of the coil assembly aiming to position the object,
  and wherein the control unit is further configured to keep a temperature between the one or more coils of the coil assembly within a predetermined range for a predetermined amount of time during positioning of the object.

According to yet another embodiment of the invention, there is provided a method of operating a lithographic apparatus comprising an actuation system for positioning an object, and a cooling system for cooling the actuation system, wherein the actuation system comprises a coil assembly including one or more coils as force generating members, wherein the cooling system comprises a cooling element interacting with the coil assembly for cooling the coil assembly,
  and wherein the method comprises the following steps:
    a) providing a force generating electric current to the one or more coils of the coil assembly to position the object;
    b) keeping a temperature difference between the one or more coils of the coil assembly and the cooling element or the temperature of the one or more coils within a predetermined range for a predetermined amount of time during positioning of the object.

According to a further embodiment of the invention, there is provided a device manufacturing method wherein use is made of a lithographic apparatus according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
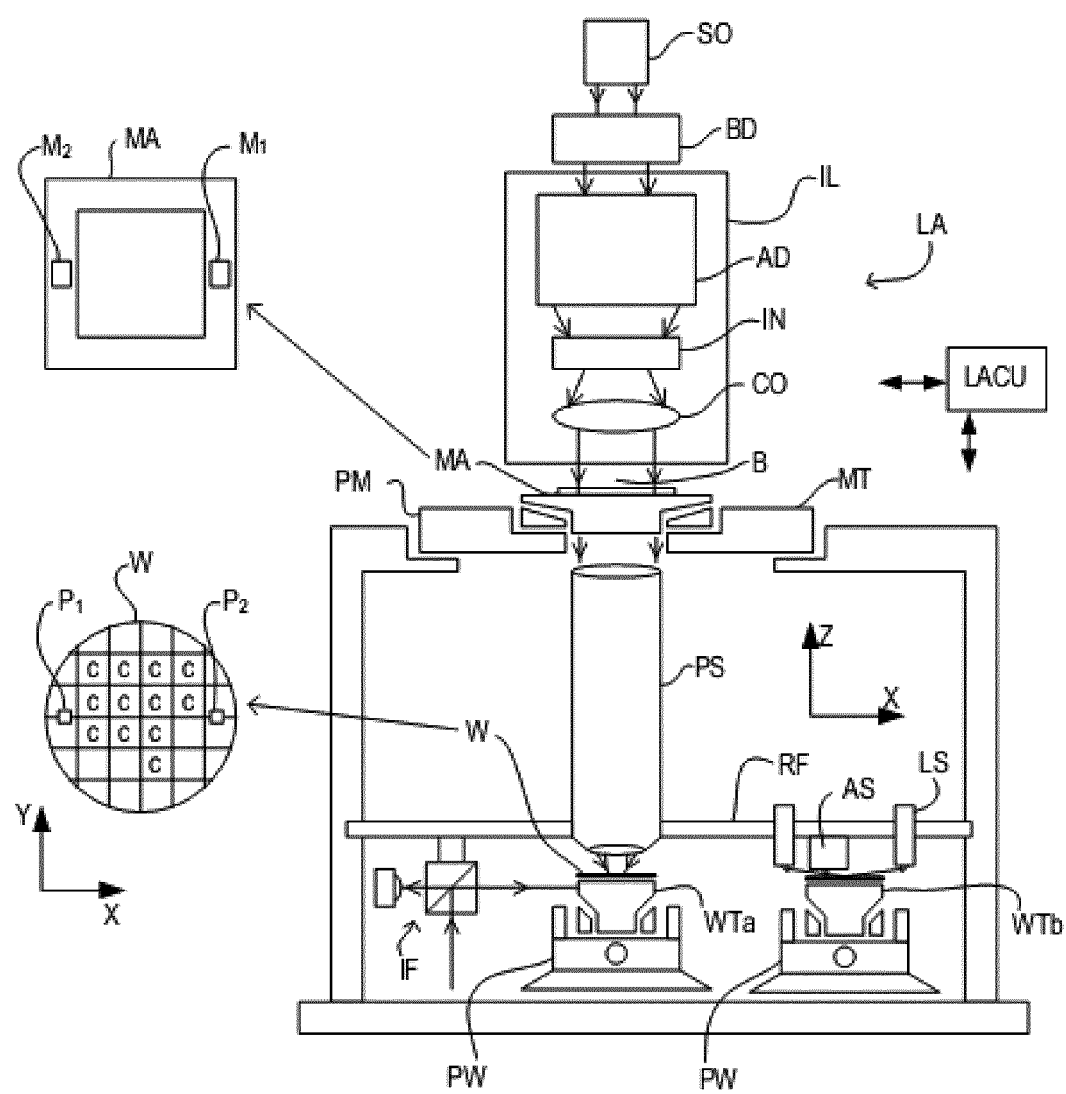
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WTa or WTb constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, and/or controlling radiation.

The support structure MT supports, i.e. bears the weight of, the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate W. It should be noted that the pattern imparted to the radiation beam may not exactly correspond to the desired pattern in the target portion of the substrate W, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The terms "radiation" and "beam" used herein encompass all types of electromagnetic radiation, including ultraviolet (UV) radiation (e.g. having a wavelength of or about 365, 248, 193, 157 or 126 nm) and extreme ultraviolet (EUV) radiation (e.g. having a wavelength in the range of 5-20 nm), as well as particle beams, such as ion beams or electron beams.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illuminator IL receives a radiation beam from a radiation source SO. The radiation source SO and the lithographic apparatus may be separate entities, for example when the radiation source SO is an excimer laser. In such cases, the radiation source SO is not considered to form part of the lithographic apparatus and the radiation beam is passed from the radiation source SO to the illuminator IL with the aid of a beam delivery system BD comprising, for example, suitable directing mirrors and/or a beam expander. In other cases the source may be an integral part of the lithographic apparatus, for example when the source is a mercury lamp. The radiation source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device MA (e.g., mask), which is held on the support structure MT (e.g., mask table), and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the mask alignment marks M1, M2 may be located between the dies.

The depicted apparatus can at least be used in scan mode, in which the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de)-magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In addition to the scan mode, the depicted apparatus could be used in at least one of the following modes:

1. In step mode, the support structure MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In another mode, the support structure MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
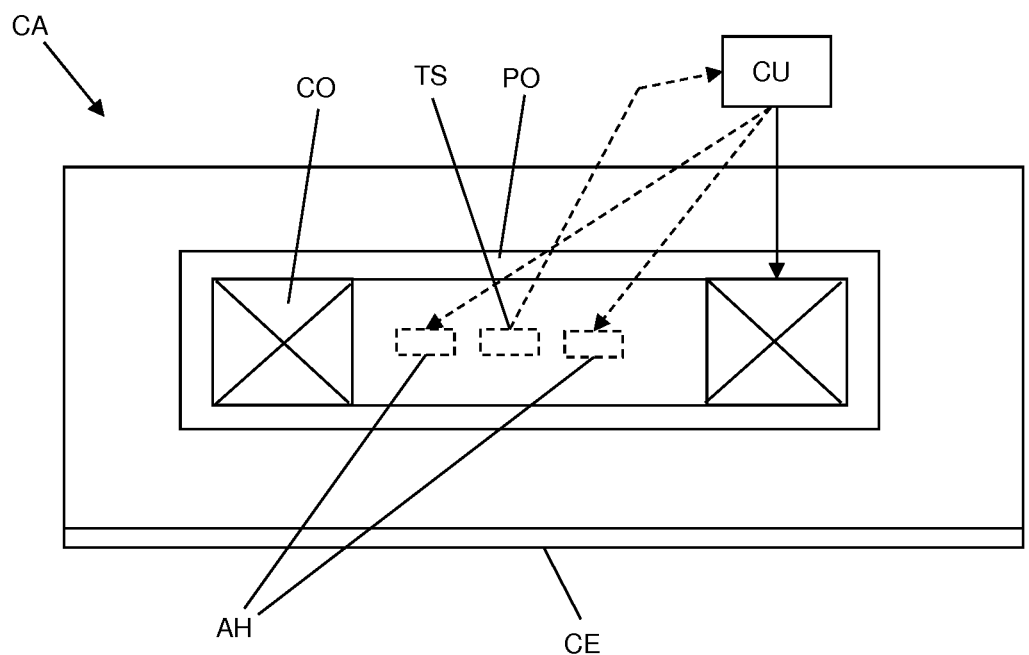
FIG. 2 schematically depicts a part of a coil assembly of an actuation system according to an embodiment of the invention.

FIG. 2 schematically depicts a part of a coil assembly CA of an actuation system according to an embodiment of the invention. The actuation system may for instance be part of the first positioner PM or the second positioner PW as described above for the lithographic apparatus of FIG. 1.

The actuation system may be configured to position an object, e.g. the support MT or the substrate table WTa/WTb. The actuation system comprises the coil assembly CA including one or more coils CO as force generating members. FIG. 2 depicts a cross section of one of the one or more coils CO.

The lithographic apparatus comprises a control unit CU for controlling the actuation system, which control unit may be part of the aforementioned lithographic apparatus control unit LACU. The control unit CU is configured to provide a force generating electric current to the one or more coils CO aiming to position the object. The actuation system may be a Lorentz-type actuation system, a reluctance-type actuation system or any other type of actuation system in which an electric current through the one or more coils generates a force applied to the one or more coils allowing to position the object, preferably due to interaction with a magnetic field, either generated by a permanent magnet or by another coil. The term force generating electric current is used to indicate that the goal of the force generating current is to generate a force and that the generation of heat is a by-product. In other words, a value of the force generating current is determined on the basis of a desired force to be applied to the object.

The lithographic apparatus comprises a cooling system allowing to cool parts of the lithographic apparatus, in this case the coil assembly CA. The cooling system therefor comprises a cooling element CE for cooling the coil assembly CA. An example of a cooling system is a liquid cooling system in which the cooling element CE is a tube, hose or cooling plate through which liquid, e.g. water, having a constant temperature runs. The liquid itself, present at the cooling plate, tube or hose may also be referred to as the cooling element. However, other cooling mechanisms, e.g. Peltier element, are also envisaged. It is explicitly noted here that the cooling system may be passive or active.

The one or more coils CO of the coil assembly CA are embedded in a layer of potting material PO. The function of the potting material PO is to transfer heat between the one or more coils CO and the cooling element CE and may further be to transmit forces generated by the one or more coils CO to other parts of the coil assembly CA. Additionally, the potting material PO may be configured to electrically isolate the one or more coils CO from other parts of the coil assembly CA. The potting material PO may be a resin or a liquid material.

The production of coil assemblies CA including potting material PO may include the step of curing the potting material PO at an elevated temperature to achieve the final strength of the potting material PO.

A drawback of the potting material PO may be that during curing the entire coil assembly CA is at an elevated temperature while during normal use the cooling element CE is usually at a lower temperature than the one or more coils CO resulting in tensile stresses in the potting material PO. Damage of the potting material, e.g. in the form of delamination, should be avoided as this may introduce additional thermal resistance that may result in too high coil temperatures and failure.

Another drawback of the potting material PO may be that fatigue parameters of the potting material PO may be unknown, or if information is available, show large variations. Additionally accelerating of lifetime tests may be difficult due to the influence of time-effects on the parameters.

In order to increase the lifetime of the components of the actuation system or to use smaller safety factors or less conservative designs, the control unit CU is configured to keep a magnitude of cyclic stress below a predetermined value, in this case by being further configured to keep a temperature difference between the one or more coils CO of the coil assembly CA and the cooling element CE within a predetermined range, e.g. showing a variation of maximum 5 degrees Celsius or maximum 10 degrees Celsius, for a predetermined amount of time during positioning of the object.

Keeping the temperature difference within a predetermined range for a predetermined amount of time during positioning of the object may be obtained in different ways, examples of which will be described below.

In a first example, the control unit CU assumes worst case scenario at all times, meaning that the actuation system may have a maximum temperature occurring when a maximum electric current is applied to the one or more coils CO for a considerable time period. The maximum electric current being determined by the allowable specifications of the actuation system or the maximum electric current the current supply system is able to provide.

In a second example, the control unit CU assumes worst case scenario during the predetermined time period, meaning that the actuation system may have a maximum temperature occurring when a maximum electric current is applied to the one or more coils CO for a considerable time period. The maximum electric current being determined by the maximum electric current expected to occur during the predetermined time period.

When the actuation system is operated to position the object, the control unit CU is configured to keep the temperature of the one or more coils CO substantially at the maximum temperature of the first or second example, so that despite variations in the applied force generating electric current, the temperature difference is substantially constant and the coil assembly goes through less thermal cycles, which diminishes the effect associated with the thermal cycles. This means that the control unit CU causes additional heat to be generated when the force generating electric current is not at its maximum allowable value.

In an embodiment, the predetermined amount of time ends when no or substantially no force generating electric current is provided to the one or more coils CO of the coil assembly CA. The predetermined amount of time may additionally or alternatively also be a fixed amount of time, e.g. when positioning the object comprises a repetitive pattern, the predetermined amount of time may be equal to one cycle of the repetitive pattern.

Additional heat, when required, can be applied using separate heating elements AH. Preferably, the use of the heating elements AH does not introduce the generation of additional forces that may interfere with the force generated using the force generating electric current. Hence, the control unit CU is configured to drive the heating elements AH in order to keep the temperature difference constant when the heat generated by the force generating electric current through the one or more coils CO of the coil assembly CA is insufficient to keep said temperature difference constant. An example of heating elements AH is a twisted pair of current carrying conductors wound within the one or more coils.

In an embodiment, control of the heating elements AH is open loop, meaning that the drive signals to the heating elements AH are based on a difference between a desired total heat generation, the calculated heat generation caused by the force generating electric current, and the operating specifications of the heating elements AH.

In an embodiment, the coil assembly CA comprises a temperature sensor TS to measure a temperature of the one or more coils CO of the coil assembly CA, wherein the drive signals to the heat elements AH are based on the measured temperature of the one or more coils CO as determined by the temperature sensor TS. Hence, control of the heating elements AH may be closed loop.

In an alternative embodiment, the temperature of the one or more coils CO can be measured by looking at the resistance of the one or more coils itself.

Additional heat, when required, can alternatively or additionally be applied using the one or more coils CO itself by providing a heat generating electric current in addition to the force generating electric current to the one or more coils CO of the coil assembly CA. The term heat generating electric current is used to indicate the electric current which goal is to provide heat to the one or more coils CO with a generation of force as a by product. In other words, the value of the heat generated electric current is based upon the amount of heat required. To minimize the interference between the forces generated by the force generating electric current and the heat generating electric current, the heat generating electric current may be modulated with a frequency above a frequency associated with a rigid body eigenmode of the moving mass, so that an alternating force is applied having a zero average value and the moving mass is minimally disturbed by the alternating force. Hence, the heat generating electric current has a frequency higher than the frequency content of the force generating electric current.

In an alternative embodiment, especially when two or more coils are present in a coil assembly, it is possible to generate a heat generating electric current in two different coils such that the generated forces are equal but opposite to each other.

In an embodiment, control of the heat generating electric current is open loop, wherein the control unit CU for instance is configured to keep a root mean square value of the sum of the force generating electric current and the heat generating electric current constant in order to keep said temperature difference constant.

In an embodiment, the coil assembly CA comprises a temperature sensor TS to measure a temperature of the one or more coils CO of the coil assembly CA, wherein the control unit is configured to determine the heat generating electric current in dependency of the measured temperature of the one or more coils CO. Hence, control of the heat generating electric current may be closed loop.

Although the above described embodiments assume that the cooling element CE has a constant or substantially constant temperature, the invention also relates to the embodiments in which the cooling element CE may not have a constant or substantially constant temperature. In such embodiments, it may be preferred to include a temperature sensor to measure a temperature of the cooling element which may be advantageous to maintain a certain temperature difference.

Although the entire application so far describes the presence of a constant temperature difference between the one or more coils and the cooling element due to the appropriate control of the control unit, it is also envisaged that the control unit is configured to keep the temperature of the one or more coils of the coil assembly within a predetermined range for a predetermined amount of time during positioning of the object in order to reduce the number and/or extent of thermal cycles.

Although the shown embodiments only depict a single coil assembly and a single coil, it is apparent to the skilled person that the invention also relates to a coil assembly including a plurality of coils and/or an actuation system comprising a plurality of coil assemblies. In the case of a plurality of coil assemblies, the control unit may be configured to control the temperature difference between respective coils of a coil assembly and the cooling element or the temperature of the respective coils independently or in dependence of each other. For instance, there may be provided a single cooling element for all coil assemblies or a cooling element per coil assembly.

Although the term "constant" may be used throughout this specification, it is explicitly mentioned here that this includes keeping variations within 1%, 5% or 10% of the respective parameter value, or in case of a temperature difference or temperature, it includes keeping variations within 1 degree Celsius, 5 degrees Celsius or 10 degrees Celsius.

Although not specifically mentioned, the control unit may include one or more amplifiers and/or a one or more power sources to supply the force generating electric currents and/or the heat generating electric currents to the one or more coils of the coil assembly.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
an actuation system configured to position an object and comprising a coil assembly comprising one or more coils as force generating members;
a cooling system configured to cool the actuation system and comprising a cooling element configured to cool the coil assembly; and
a control unit configured to:
control the actuation system;
provide a heat generating electric current having a modulation frequency to the one or more coils to generate heat at the one or more coils; and
control a temperature of the one or more coils, using the heat generating electric current, to keep a magnitude of cyclic stress below a predetermined value.

2. The lithographic apparatus of claim 1, wherein the control unit is further configured to keep a temperature difference between the one or more coils of the coil assembly and the cooling element within a predetermined range for a predetermined amount of time during positioning of the object in order to keep the magnitude of cyclic stress below a predetermined value.

3. The lithographic apparatus of claim 1, wherein the control unit is further configured to keep a temperature of the one or more coils of the coil assembly within a predetermined range for a predetermined amount of time during positioning of the object in order to keep the magnitude of cyclic stress below a predetermined value.

4. The lithographic apparatus of claim 1, wherein the coil assembly further comprises separate heating elements configured to heat the one or more coils of the coil assembly.

5. The lithographic apparatus of the claim 1, wherein the control unit is configured to provide a force generating electric current to the one or more coils to adjust a position of the object.

6. The lithographic apparatus of claim 5, wherein the control unit is further configured to keep a root mean square value of a sum of the force generating electric current and the heat generating electric current within a predetermined range.

7. The lithographic apparatus of claim 5, wherein:
the coil assembly further comprises a temperature sensor to measure a temperature of the one or more coils of the coil assembly; and
the control unit is further configured to determine the heat generating electric current in dependency of the measured temperature of the one or more coils.

8. The lithographic apparatus of claim 1, wherein the frequency is such that an alternating force is applied by the one or more coils such that the actuating system is stationary.

9. The lithographic apparatus of claim 1, wherein the coil assembly further comprises potting material arranged between the one or more coils and the cooling element.

10. The lithographic apparatus of claim 1, further comprising:
an illumination system configured to condition a radiation beam;
a support configured to support a patterning device, the patterning device configured to pattern the radiation beam with a pattern in its cross-section to form a patterned radiation beam;
a substrate table configured to hold a substrate; and
a projection system configured to project the patterned radiation beam onto a target portion of the substrate,
wherein the actuation system is further configured to position the support or the substrate table.

11. The lithographic apparatus of claim 1, wherein:
the coil assembly further comprises two or more coils; and
the control unit is further configured to provide force generating electric currents to the two or more coils such that generated forces are opposite.

12. A method of operating a lithographic apparatus comprising an actuation system for positioning an object and a cooling system for cooling the actuation system, the actuation system comprising a coil assembly including one or more coils as force generating members, the cooling system comprising a cooling element for cooling the coil assembly, and the method comprising:
transmitting a force generating electric current to the one or more coils of the coil assembly to position the object;
transmitting a heat generating electric current having a modulation frequency to the one or more coils to generate heat at the one or more coils; and
maintaining, using the heat generating electric current, a temperature difference between the one or more coils of the coil assembly and the cooling element or a temperature of the one or more coils within a predetermined range for a predetermined amount of time during positioning of the object.

13. The method of claim 12, wherein the maintaining comprises:
determining an amount of heat generated by the force generating electric current; and
adding additional heat to the one or more coils of the coil assembly when the amount of heat generated by the force generating electric current is insufficient.

14. The method of claim 13, wherein the adding is carried out by driving heat elements in the coil assembly.

15. The method of claim 13, wherein the adding is carried out by adding the heat generating electric current to the force generating electric current and providing a sum of the electric currents to the one or more coils.

16. The method of claim 15, wherein an alternating force, associated with the modulation frequency, applied by the one or more coils is such that the actuating system is stationary.

17. The method of claim 12, wherein the maintaining comprises:
measuring the temperature difference between the one or more coils and the cooling element or measuring the temperature of the one or more coils; and
adding additional heat to the one or more coils of the coil assembly when the amount of heat generated by the force generating electric current is insufficient.

18. The method of claim 12, further comprising providing force generating electric currents to two or more coils of the coil assembly such that generated forces are opposite.

19. A device manufacturing method using a lithographic apparatus, the method comprising:
generating a force using a coil assembly of an actuation system to position an object in the lithographic apparatus;
controlling the actuation system using a control unit;
controlling a temperature of the coil assembly using a cooling system;

transmitting a heat generating electric current having a modulation frequency to the coil assembly to generate heat at the coil assembly; and controlling a temperature of the coil assembly, using the heat generating electric current, to maintain a magnitude of cyclic stress below a predetermined value.

* * * * *